United States Patent [19]

Hotta et al.

[11] Patent Number: 4,525,261

[45] Date of Patent: Jun. 25, 1985

[54] SPUTTERING METHOD

[75] Inventors: Hiroshi Hotta; Yoshiharu Suzuki, both of Fuji, Japan

[73] Assignee: Polyplastics Co. Ltd., Osaka, Japan

[21] Appl. No.: 547,812

[22] Filed: Nov. 1, 1983

[30] Foreign Application Priority Data

Nov. 17, 1982 [JP] Japan ................................ 57-201410

[51] Int. Cl.$^3$ .............................................. C23C 15/00
[52] U.S. Cl. .......................... 204/192 EC; 204/192 R; 204/192 C; 428/461; 428/462
[58] Field of Search ........ 204/192 EC, 192 R, 192 C; 428/461, 462

[56]  References Cited

U.S. PATENT DOCUMENTS

| | | | |
|---|---|---|---|
| 4,101,402 | 7/1978 | Vossen et al. | 204/192 C |
| 4,131,530 | 12/1978 | Blum | 204/192 C |
| 4,180,448 | 12/1979 | Soshiki et al. | 204/192 C |
| 4,344,996 | 8/1982 | Banks et al. | 204/192 EC |
| 4,369,225 | 1/1983 | Manabe et al. | 204/192 C |
| 4,374,717 | 2/1983 | Drauglis et al. | 204/192 C |
| 4,402,998 | 9/1983 | Kumagai | 204/192 EC |
| 4,405,678 | 9/1983 | Downing et al. | 428/461 |

OTHER PUBLICATIONS

Chang, Vacuum 32, (1982), pp. 19-22.
Thornton, 18th Annual Soc. of Vac. Coaters Conference, Apr. 7-9, 1975, pp. 8-26.

*Primary Examiner*—Arthur P. Demers
*Attorney, Agent, or Firm*—Robert M. Shaw

[57]  ABSTRACT

The sputtering on polyacetal article is improved by coating the article, before the sputtering step, with a primer solution of a chlorinated polyolefin in a chlorine-containing solvent in respect to adhesion between the article and the sputtering layer.

11 Claims, No Drawings

SPUTTERING METHOD

The present invention relates to a method of sputtering which is one of methods for metallizing plastics, in particular to a method of sputtering of polyacetal molded products.

In general, a method of metallizing resins having excellent painting property, for example ABS resin and the like, consists of a step of degreasing molded products by means of suitable solvents, a step of applying base coat, for example urethane paint, acrylurethane paint, acrylester paint and the like, on said molded products and drying, a step for forming a thin metallic layer of chromium SUS-304, chromium alloys, aluminium and the like having a thickness of about 300 to 1,000 Å on said base coat under the pressure of argon gas of $5 \times 10^{-3}$ to $2 \times 10^{-4}$ torr by means of a sputtering apparatus, and a step for applying top coat, for example acrylester paint, acrylurethane paint and the like, on said thin metallic layer to give metallic luster to said molded products.

However, an effective base coat paint, which gives sufficient adhesion to molded products by merely degreasing said molded products, has never been found since polyacetal resin is crystalline resin and chemically stable. Accordingly, the usual method of sputtering can not be adopted without modification.

Although Japanese Patent Application No. 127593/1980 discloses a method of sputtering wherein polyacetal molded products are coated with primer, cellulose paint, and dried followed by being coated with base coat in order to give sufficient adhesion of the usual sputtering paint to polyacetal molded products, maintain the smoothness of coat even after painting and give sufficient performance to molded products metallized by sputtering so that they may be sufficiently used in practice, it is not a sufficiently satisfying method since the drying temperature after painting is remarkably high, thereby it is feared that the materials are transformed.

The inventors have found that metallized polyacetal molded products, which can be sufficiently used in practice, can be obtained by applying chlorinated polyolefin paint, which does not require forced drying thereon as the primer. This discovery led to the present invention.

That is to say, the present invention relates to a method of sputtering wherein polyacetal molded products are metallized by means of sputtering, characterized in that the primer obtained by dissolving chlorinated polyolefin resin in chlorine-containing solvents is applied on said molded products and then said molded products are subjected to sputtering in order to increase the adhesion of the thin metallic layer to said molded products.

The mixture of chlorinated polyethylene resin or chlorinated polypropylene resin and one or two kinds of resin selected from a group consisting of modulated alkyd resin (for example acrylated alkyd resin), vinyl resin (for example vinyl chloride, vinyl acetate, acrylic resin and vinyl chloride-vinyl acetate copolymer) and the like is preferably used for chlorinated polyolefin resin in the present invention. Further, chlorine-containing solvents include orthodichlorbenzene and the like. Aromatic solvents, for example benzene, toluene and the like, can be added to the primer to decrease the viscosity thereof in case when the viscosity of the primary used in the present invention.

Fillers such as calcium carbonate and talc, organic reforming agents such as styrene-butadiene copolymer and thermoplastic polyurethane, inorganic reinforcing agents such as glass fiber, bead and flake and mica, organic reinforcing agent, stabilizer and the like may be added to polyacetal resin which is the raw material for polyacetal molded products used in the present invention.

According to the present invention, polyacetal molded products applied with said primer thereon are laid in air at room temperature for 5 to 60 minutes, preferably 10 to 30 minutes, to naturally dry. Then the base coat such as urethane paint is applied on said primer. The base coat is dried at 80° to 140° C., preferably 100° to 120° C., for 15 minutes or more, preferably 30 minutes or more to obtain strong adhesion of said primer to the base material. A thin metallic layer is formed on said base coat by sputtering and then the top coat is applied on said thin metallic layer to obtain molded products having a surface of high quality and metallic luster.

Although the process for applying said base coat can be omitted if chlorinated polyolefin primer is used in the present invention, the external appearance is slightly inferior.

The embodiments of the invention will be summarized below in other words. The invention relates to a method for metallizing a polyacetal molded article on the surface thereof by sputtering, which comprises the steps of: first coating the polyacetal molded article with a primer solution comprising a chlorinated polyolefin resin and a chlorine-containing solvent to dissolve therein said resin and then sputtering a metal on the treated polyacetal molded article. The chlorinated polyolefin resin is selected from chlorinated polyethylene, chlorinated polypropylene and a blend mixture of chlorinated polyethylene or chlorinated polypropylene and another resin. The other resin is one or a mixture of a modified alkyd resin and a vinyl resin. The primary solution is coated in such an amount as to have a thickness of 3 to 20 microns, preferably from 5 to 10 microns, in the dried state.

The present invention will be described in more detail below with reference to the examples.

EXAMPLES 1 TO 7

A primer obtained by dissolving a mixture consisting of chlorinated polyethylene resin and acrylated alkyd resin (at a ratio of 7:3 by weight) in a mixture consisting of orthodichlorbenzene and toluene (at a ratio of 1:1 by weight) at a ratio of resin to solvent of 1:0.8 by weight was applied on a molded flat plate ($50 \times 70 \times 3$ mm) of polyacetal copolymer "Duracon" M90-02 (manufactured by Polyplastics Co., Ltd.) by means of a spray method. The coating with paint was carried out by using spray gun W. SER 61-1G manufactured by Iwata Aircompressor Mfg. Co., Ltd. under the conditions that spray pressure was 3 to 5 kg/cm$^2$ and the distance between the spray gun and material to be coated was 25 to 30 mm. The setting is carried out at room temperature for 2 to 60 minutes after applying the primer in order to remove solvents and make the paints even. Base coat EXP 1245 manufactured by Fujikura Kasei Co., Ltd. was further applied on the primer. The applied base coat is subjected to forced drying at 100° C. for 60 minutes and then a chromium alloy layer having film thickness of 3 to 500 Å was formed by sputtering by means of a sputtering apparatus CFS-8ES manufactured by Tokuda Works, Ltd. under the condition that argon gas pressure was $5 \times 10^{-3}$ torr or less. After sputtering top coat EXP 1380 manufactured by Fujikura Kasei Co., Ltd. was applied on the chromium alloy layer and then subjected to forced-drying at 80° C. for 30 minutes. But said base coat was not applied and said chromium alloy layer was formed by sputtering immediately after the application of the primer in Example 7.

Eleven lines were marked off on the resulting metallized coat at 1 mm intervals by means of a knife to produce 100 squares which were tested on the forced separation by means of JIS cellophane tape to evaluate adhesion of the metallized coat to mother material on the basis of the number of residual squares per 100 squares.

The evaluation results of adhesion and external appearance are shown in Table 1.

REFERENCE EXAMPLES 1 TO 3

The results for the cases when cellulose type primer (84-3701) manufactured by Celanese Co., Ltd. was used instead of chlorinated polyolefin type primer used in Examples 1 to 7 and those for the case when the primer was not used are also shown in Table 1.

TABLE 1

| Example No. and reference example No. | Primer | Drying conditions of the primer | Adhesion of metallized coat | External appearance |
|---|---|---|---|---|
| Example | | | | |
| 1 | Chlorinated poly-olefine type primer | 23° C. × 2 minutes | 90 | Good |
| 2 | Chlorinated poly-olefine type primer | 23° C. × 5 minutes | 100 | " |
| 3 | Chlorinated poly-olefine type primer | 23° C. × 10 minutes | 100 | " |
| 4 | Chlorinated poly-olefine type primer | 23° C. × 15 minutes | 100 | " |
| 5 | Chlorinated poly-olefine type primer | 23° C. × 30 minutes | 100 | " |
| 6 | Chlorinated poly-olefine type primer | 23° C. × 60 minutes | 100 | " |
| 7 | Chlorinated poly-olefin type primer (without base coat) | 23° C. × 20 minutes | 100 | Slightly good |
| Reference Example | | | | |
| 1 | Cellulose type primer | 80° C. × 100 minutes | 50 | Bad |
| 2 | Cellulose type primer | 155° C. × 30 minutes | 100 | Good |
| 3 | Cellulose type Without primer | — | 0 | — |

EXAMPLE 8 TO 14

Metallizing was carried out in the same manner as in Example 1 excepting that the drying conditions of the base coat applied on the coat of chlorinated polyolefin type primer after drying said primer at room temperature for 15 minutes were changed as shown in Table 2. The test results of metallized coat on adhesion are shown in Table 2.

TABLE 2

| Example | Dry conditions of the base coat | Adhesion of metallized coat |
|---|---|---|
| 8 | 70° C. × 30 minutes | 80 |
| 9 | 70° C. × 60 minutes | 90 |
| 10 | 80° C. × 30 minutes | 100 |

TABLE 2-continued

| Example | Dry conditions of the base coat | Adhesion of metallized coat |
|---|---|---|
| 11 | 100° C. × 30 minutes | 100 |
| 12 | 120° C. × 30 minutes | 100 |
| 13 | 140° C. × 15 minutes | 100 |
| 14 | 140° C. × 30 minutes | 100 |

The embodiments of the invention in which an exclusive property or privilege is claimed are defined as follows:

1. A method for metallizing a polyacetal molded article on the surface thereof by sputtering, which comprises the steps of: first coating the polyacetal molded article with a primer solution comprising a chlorinated polyolefin resin and a chlorine-containing solvent to dissolve therein said resin and then sputtering a metal on the treated polyacetal molded article.

2. The method as claimed in claim 1, in which said chlorinated polyolefin resin is selected from the group consisting of chlorinated polyethylene, chlorinated polypropylene and a blend mixture of chlorinated polyethylene or chlorinated polypropylene and another resin and said other resin is one or more selected from the group consisting of a modified alkyd resin and a vinyl resin.

3. The method as claimed in claim 2, in which said modified alkyd resin is an acrylated alkyd resin and said vinyl resin is selected from the group consisting of polyvinyl chloride, polyvinyl acetate, polyacrylic acid, polyacrylate, polymethacrylic acid, polymethacrylate and a copolymer of vinyl chloride and vinyl acetate.

4. The method as claimed in claim 1 or 2, in which said chlorine-containing solvent is ortho-dichlorobenzene.

5. The method as claimed in claim 1, in which said primary solution further comprises an aromatic solvent to reduce a viscosity thereof.

6. The method as claimed in claim 1, in which said primer solution is coated in such an amount as to have a thickness of 3 to 20 microns in the dried state.

7. The method as claimed in claim 1, in which the polyacetal molded article treated with said primer solution is further coated with a base coat, before the sputtering step.

8. The method as claimed in claim 7, in which said base coat is a polyurethane paint.

9. A metallized polyacetal article comprising:
an inner core of polyacetal material;
an inner coating of a primer material comprising a chlorinated polyolefin resin;
an outer coating comprising a thin layer of sputtered metal.

10. The metallized polyacetal article according to claim 9 wherein said inner coating of primer material has a thickness of 3–20 microns.

11. The metallized polyacetal article according to claim 9 further comprising a coating of base paint intermediate to said inner coating of primer material and said outer coating of sputtered metal.

* * * * *